United States Patent
Tang et al.

(10) Patent No.: US 10,482,968 B1
(45) Date of Patent: Nov. 19, 2019

(54) LOCAL X-DECODER AND RELATED MEMORY SYSTEM

(71) Applicant: Wuhan Xinxin Semiconductor Manufacturing Co., Ltd., Wuhan, Hubei Province (CN)

(72) Inventors: Yuan Tang, San Jose, CA (US); Jen-Tai Hsu, San Jose, CA (US)

(73) Assignee: Wuhan Xinxin Semiconductor Manufacturing Co., Ltd., Wuhan, Hubei Province (CN)

( * ) Notice: Subject to any disclaimer, the term of this patent is extended or adjusted under 35 U.S.C. 154(b) by 0 days.

(21) Appl. No.: 16/198,859

(22) Filed: Nov. 22, 2018

(51) Int. Cl.
G11C 16/04 (2006.01)
G11C 16/08 (2006.01)
G11C 16/30 (2006.01)
G11C 16/14 (2006.01)

(52) U.S. Cl.
CPC .............. *G11C 16/08* (2013.01); *G11C 16/14* (2013.01); *G11C 16/30* (2013.01)

(58) Field of Classification Search
CPC .......... G11C 16/08; G11C 16/14; G11C 16/30
USPC ....................................................... 365/185.13
See application file for complete search history.

(56) References Cited

U.S. PATENT DOCUMENTS

| | | | |
|---|---|---|---|
| 8,456,922 B2 * | 6/2013 | Chen | G11C 16/08 365/185.02 |
| 2011/0157989 A1 * | 6/2011 | Iwata | G11C 16/0483 365/185.17 |
| 2013/0083599 A1 * | 4/2013 | Nam | G11C 16/14 365/185.11 |

* cited by examiner

*Primary Examiner* — Vu A Le
(74) *Attorney, Agent, or Firm* — Winston Hsu

(57) ABSTRACT

A local X-decoder for a memory system includes a decoding unit configured to generate a word line signal to a memory cell of a memory array of the memory system; and an unselected erase detecting unit coupled to the decoding unit, and configured to increase an absolute voltage coupled to the word line signal from a well of the memory cell according to an unselected erase mode signal generated by an erase mode decoder of the memory system; wherein the word line signal is floating to a same level as the well of the memory cell when the memory cell is unselected in an erase mode of the memory system.

20 Claims, 5 Drawing Sheets

LOCAL X-DECODER AND RELATED MEMORY SYSTEM

BACKGROUND OF THE INVENTION

1. Field of the Invention

The present invention relates to a local X-decoder and related NOR flash memory system, and more particularly, to a local X-decoder and related NOR flash memory system for avoiding well disturb failures caused by unselected word line in erase mode.

2. Description of the Prior Art

FIG. 1 is a functional block diagram of a memory system 1 of the prior art. The memory system 1 may be a NOR flash memory system, and include a memory cell, a local word line decoder for generating a control signal PWL, a local X-decoder (row decoder) 2 for generating a control signal WL, a global word line decoder for generating a control signal GWLb, a power source for generating a voltage source VPPX, and multiple voltage source decoders for respectively generating voltage sources SVPPX, VEEX, and SVEEX to the local X-decoder and the global word line decoder.

FIG. 2 is a schematic diagram of the local X-decoder 2 in FIG. 1. The local X-decoder includes transistors P0, N1, and N2. For a NOR flash memory cell, when the local X-decoder detects an erase mode (wherein the bank mode voltage source VEEX is −9 V (volts)), the unselected control signal WL (wherein the control signal GWLb is 0 volt) can only be coupled to as high as a threshold voltage VT of the transistor P0 because the transistor P0 is turned on above its threshold voltage VT. An electric field across the gate oxide of the NOR flash cell is close to the bias on its well (e.g., 9V). Since a total well disturb time being a product of an erase time and a number of erase cycles is very long, a programmed bit (bit '0') of the NOR flash cell may unintentionally become an erased bit (bit '1').

In the erase mode of the unselected local X-decoder 2, a voltage difference across a gate oxide of the transistor N2 is a threshold voltage VT plus the global word line signal plus (e.g., VT+9V). The extra voltage difference of the threshold voltage VT will generate a higher GIDL (gate induced drain leakage) which will damage the local X-decoder 2 when the local X-decoder 2 is under the stress for a long time (e.g., the erase disturb time).

In order to avoid well disturb failures (i.e., a programmed bit unintentionally become an erased bit during well disturb time) and the gate induced drain leakage from damaging the local X-decoder 2, there is a need to redesign the local X-decoder 2 of the prior art.

SUMMARY OF THE INVENTION

It is therefore an objective of the present invention to provide an X-decoder and related NOR flash memory system for avoiding well disturb failures caused by unselected word line in erase mode.

The present invention discloses a local X-decoder for a memory system including a decoding unit configured to generate a word line signal to a memory cell of a memory array of the memory system; and an unselected erase detecting unit coupled to the decoding unit, and configured to increase an absolute voltage coupled to the word line signal from a well of the memory cell according to an unselected erase mode signal generated by an erase mode decoder of the memory system; wherein the word line signal is floating to a same level as the well of the memory cell when the memory cell is unselected in an erase mode of the memory system.

The present invention further discloses a memory system including a memory array, a power source, a bank decoder, an erase mode decoder, and a local X-decoder. The memory array includes a memory cell. The power source is configured to generate a first voltage source. The bank decoder is configured to generate a local mode voltage source. The erase mode decoder is coupled to the bank decoder and the power source, and configured to generate an unselected erase mode signal according to the first voltage source and the local mode voltage source. The local X-decoder is coupled to the memory cell and the erase mode decoder, and includes a decoding unit configured to generate a word line signal to of the memory cell; and an unselected erase detecting unit coupled to the decoding unit, and configured to increase an absolute voltage coupled to the word line signal from a well of the memory cell according to the unselected erase mode signal; wherein the word line signal is floating when the memory cell is unselected in an erase mode of the memory system.

These and other objectives of the present invention will no doubt become obvious to those of ordinary skill in the art after reading the following detailed description of the preferred embodiment that is illustrated in the various figures and drawings.

DETAILED DESCRIPTION

Figure 3:
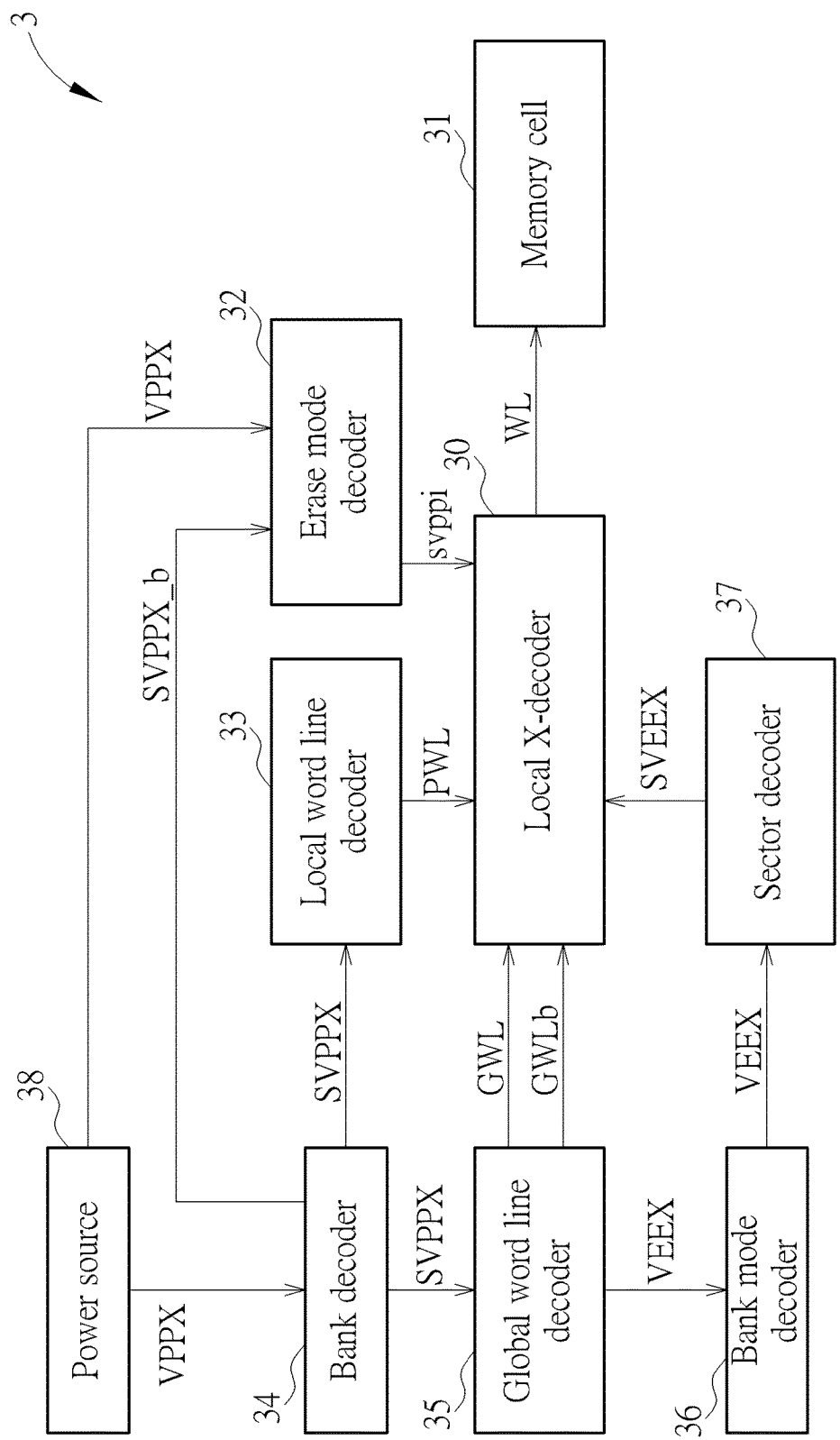
FIG. 3 is a functional block diagram of a memory system according to an embodiment of the present invention.

FIG. 3 is a functional block diagram of a memory system 3 according to an embodiment of the present invention. The memory system 1 may be a NOR flash memory system, and includes a memory cell 31, an X-decoder 30, an erase mode detector 32, a local word line decoder 33, a bank decoder 34, a global word line decoder 35, a bank mode decoder 36, a sector decoder 37, and a power source 38.

The power source 38 is coupled to the erase mode detector 32 and the bank decoder 34, and configured to generate a voltage source VPPX to the erase mode decoder 32 and the bank decoder 34. The voltage source VPPX is configured to supply power to a plurality of banks of a memory array (not shown in FIG. 3) of the memory system 3.

The bank decoder 34 is coupled to the local word line decoder 33, the global word line decoder 35 and the power source 38, and configured to generate a voltage source SVPPX to the local word line decoder 33 and a local mode voltage source SVPPX_b to the erase mode decoder 32 according to the voltage source VPPX. The voltage source SVPPX is configured to select one of the plurality of banks, e.g., select one of 512 banks. The local mode voltage source SVPPX_b is configured to indicate an erase mode when it is 9V, and indicate all other conditions when it is not 9V.

The erase mode detector 32 is coupled to the local X-decoder 30, the power source 38 and the bank decoder 34, and configured to generate an unselected erase mode signal svppi to the local X-decoder 30 according to the voltage source VPPX and the voltage source VPPX. The unselected erase mode signal svppi is configured to indicate an unselected word line in erase mode when it is 0 volt, and indicate all other conditions when it is not 0 volt.

The local word line decoder 33 is coupled to the local X-decoder 30 and the bank decoder 34, and configured to generate a local word line signal PWL according to the voltage source SVPPX.

The bank mode decoder 36 is coupled to the global word line decoder 35 and the sector decoder 37, and configured to generate a bank mode voltage source VEEX. The bank mode voltage source VEEX is configured to select an operating mode for one of the plurality banks of the memory array of the memory system 3.

The global word line decoder 35 is coupled to the local X-decoder 30, the bank decoder 34 and bank mode decoder 36, and configured to generate a global word line signal GWL and a locally global word line signal GWLb to the local X-decoder 30 according to the voltage sources SVPPX and VEEX.

The sector decoder 37 is coupled to the local X-decoder 30 and the bank mode decoder 36, and configured to generate a sector voltage source SVEEX to the local X-decoder 30 according to the bank mode voltage source VEEX. The sector voltage source SVEEX is configured to select one of a plurality of sectors of a bank of the memory array.

The local X-decoder 30 is coupled to the memory cell 31, the erase mode detector 32, the global word line decoder 35 and the sector decoder 37, and configured to generate a word line signal WL to the memory cell 31 to the memory cell 31 according to the local word line signal PWL, the unselected erase mode signal svppi and the sector voltage source SVEEX.

Figure 4:
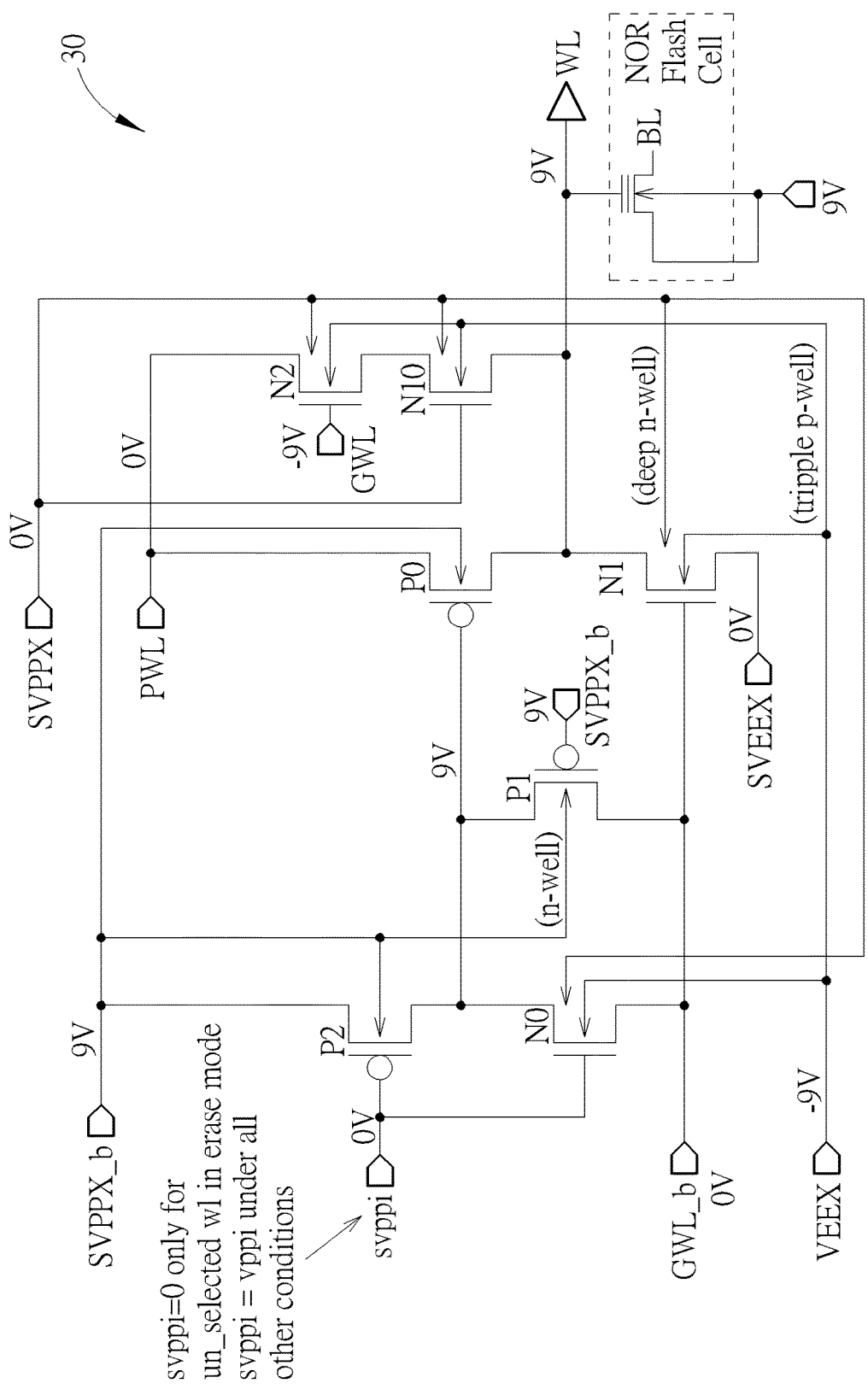
FIG. 4 is a schematic diagram of the local X-decoder in FIG. 3 according to an embodiment of the present invention.

FIG. 4 is a schematic diagram of the local X-decoder 30 according to an embodiment of the present invention. The local X-decoder 30 includes transistors N0, N1, N10, N2, P0, P1 and P2. The transistors N0, N1, N10, N2 may be an NMOS (N-type metal-oxide semiconductor), and the transistors P0, P1 and P2 may be a PMOS (P-type metal-oxide semiconductor).

The transistors P0, N1 and N2 form a decoding unit, wherein the decoding unit is configured to generate the word line signal WL to the memory cell 31 according to the voltages sources SVPPX, SVEEX and VEEX, the local word line signal PWL, the global word line signal GWL and the locally global word line signal GWLb.

The transistor P0 includes a source and a base coupled to the local word line signal PWL, a gate coupled to the GWLB and a drain configured to generate the word line signal WL to the memory cell 31. The transistor N1 includes a drain coupled to the drain of the transistor P0, a gate coupled to the locally global word line signal GWLb, a base coupled to the bank mode voltage source VEEX, and a source coupled the sector voltage source SVEEX. The transistor N2 includes a drain coupled to the local word line signal PWL, a gate coupled to the global word line signal GWL, a base coupled to the bank mode voltage source VEEX, and a source coupled to the drain of the transistor P0 when the transistor N10 is turned on. Deep n-wells of the transistors N1 and N2 are coupled together, and the bases of the transistors N1 and N2 are formed in a triple p-well.

The transistors N0, P1 and P2 form an unselected erase detecting unit, wherein the unselected erase detecting unit is configured to increase an absolute voltage coupled to the word line signal WL from the well of the NOR flash cell 31. In other words, the unselected erase detecting unit is configured to keep the transistor P0 off when the word line signal WL rises to 9V through coupling so that a voltage difference between the well of the NOR flash cell 31 and the unselected word line signal WL can be reduced. Therefore, well disturb failures may be avoided.

The transistor P2 includes a source and a base coupled to the local mode voltage source SVPPX_b, a gate coupled to the unselected erase mode signal svppi, and a drain coupled to the gate of the transistor P0. The transistor N0 includes a drain coupled to the drain of the transistor P2, a base coupled to the bank mode voltage source VEEX, a gate coupled to the unselected erase mode signal svppi, and a source coupled to the locally global word line signal GWLb and the gate of the transistor N1. The transistor P1 includes a source coupled to the drains of the transistors P2 and N0 and the gate of the transistor P0, a gate and a base coupled to the local mode voltage source SVPPX_b, and a drain coupled to the locally global word line signal GWLb, the source of the transistor N0 and the gate of the transistor N1. The bases of the transistors P1 and P2 are formed in an n-well. The base of the transistor N0 is formed in the triple p-well together with the bases of the transistors N1 and N2. A deep n-well of the transistor N0 is coupled together with the transistors N1 and N2.

Figure 1:
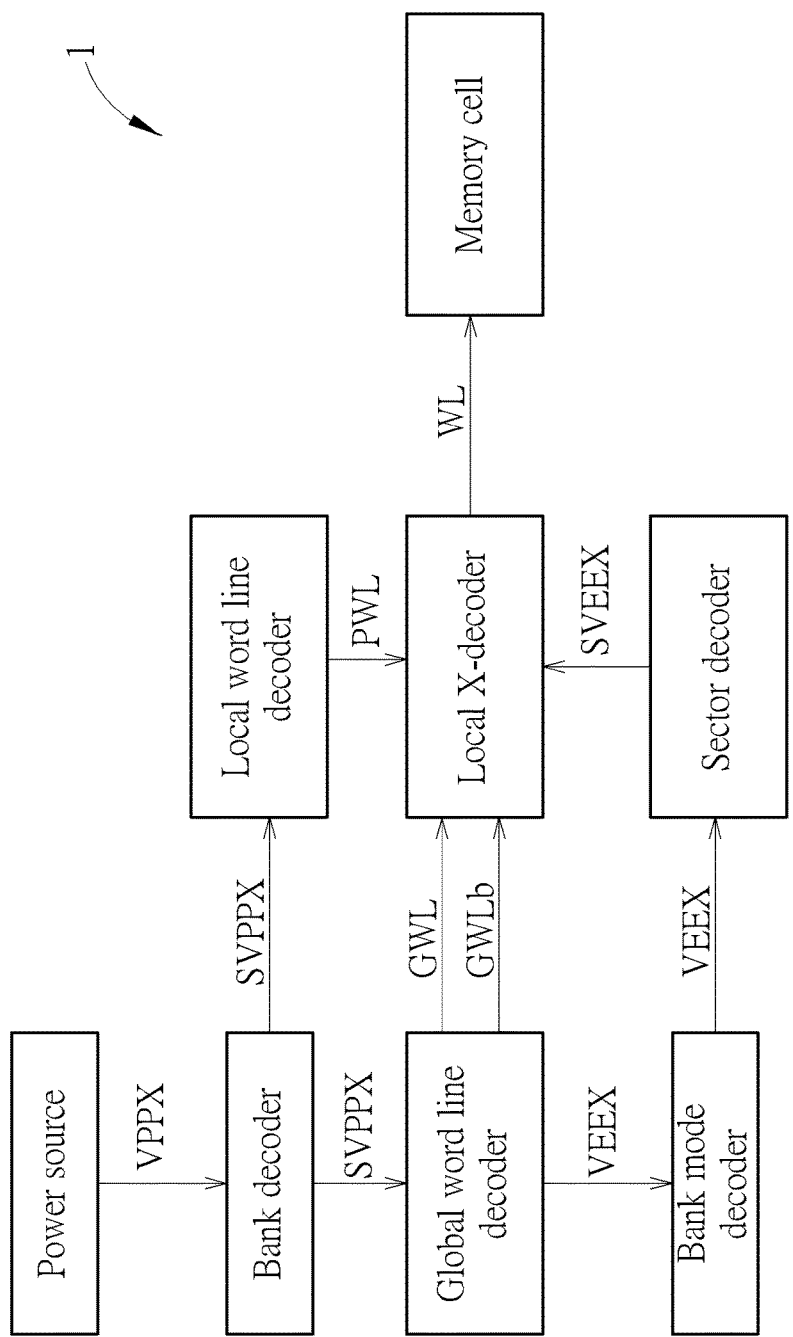
FIG. 1 is a functional block diagram of a memory system of the prior art.
Figure 2:
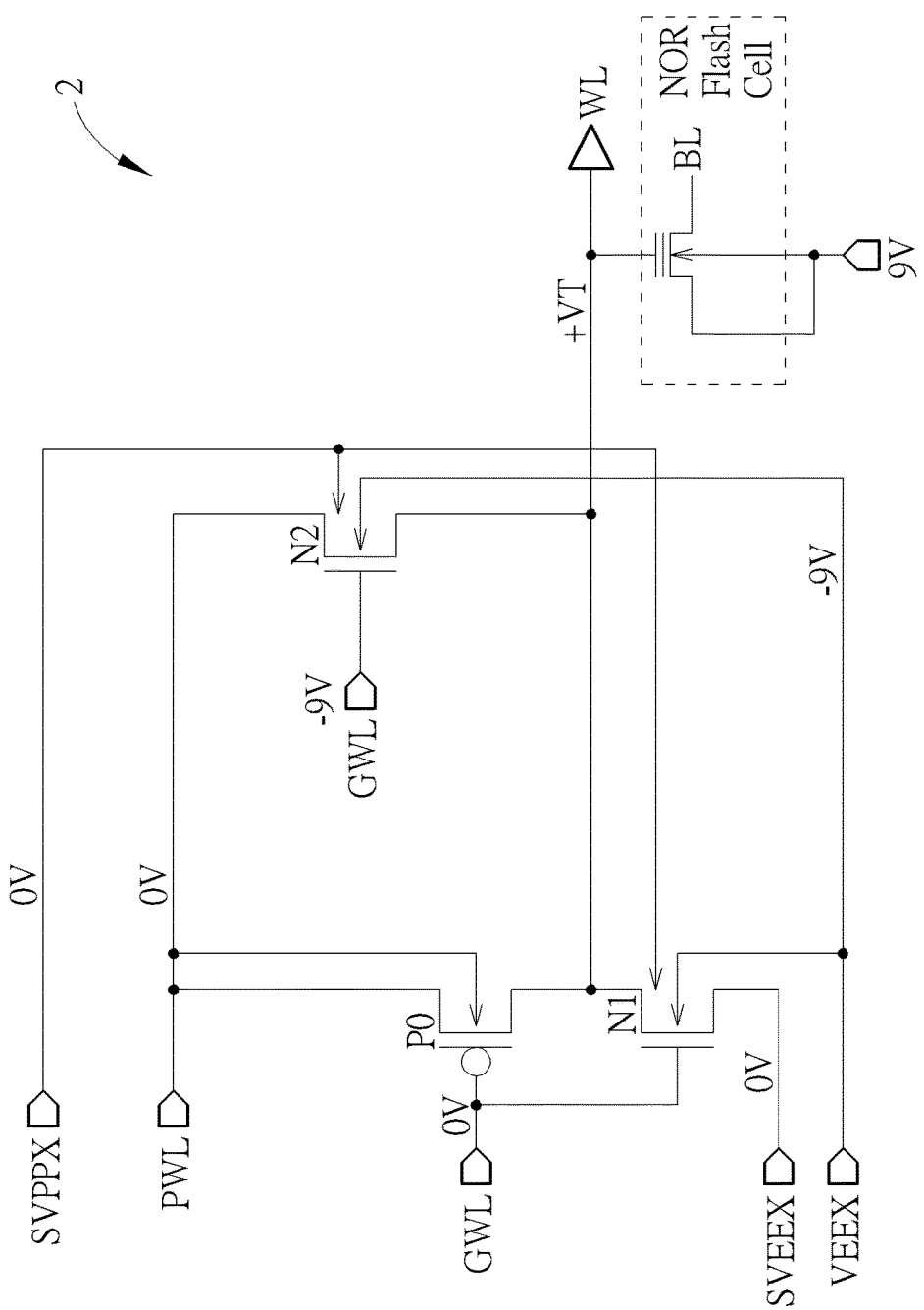
FIG. 2 is a schematic diagram of the local X-decoder in FIG. 1 of the prior art.

The transistors N0 and P1 are configured to separate the gates of the transistors N1 and P0 because they need to have different biases under the condition in FIG. 2 (i.e., the unselected erase mode for the local X-decoder 2).

In one embodiment, the transistor N10 is configured to be a voltage clamping transistor in the local X-decoder 30 to reduce a voltage difference across the gate oxide of the transistor N2 by an amount of a threshold voltage VT of the transistor N10. Therefore, a reliability weak point (i.e., the gate oxide of the transistor N2) in the local X-decoder 30 can be removed.

The transistor N10 includes a drain coupled to the source of the transistor N2, a gate coupled to the voltage source SVPPX, a base coupled to the bank mode voltage source VEEX, and a source coupled to the drains of the transistors P0 and N1. The base of the transistor N10 is formed in the triple p-well together with the bases of the transistors N0, N1 and N2.

The operating conditions of FIG. 4 are summarized in Table 1 as follows. Note that the unselected erase mode signal svppi is 0V only for unselected erase mode.

TABLE 1

Operating conditions of FIG. 4

| Condition | Description |
|---|---|
| SVPPX_b = 9 V | Erase mode |
| Svppi = 0 V | Unselected local word line in erase mode |
| GWLb = 0 V | Unselected locally global word line |
| VEEX = −9 V | Selected bank mode to be erase mode |
| SVPPX = 0 V | Selected bank power |
| PWL = 0 V | Unselected local word line |
| GWL = −9 V | Selected global word line |
| SVEEX = 0 V | Unselected sector |

The unselected erase mode signal svppi provides 0V to turn on the transistor P2. The local mode voltage source SVPPX_b provides 9V through the transistor P2 to the gate of the transistor P0, so the transistor P0 is disconnected from the local word line signal PWL(=0V). Meanwhile, all the transistors N1, N2, N10, P0, P1 and P2 are turned off to make the word line signal WL rise to 9V. This means the word line signal WL is floating at 9V and there is no voltage difference across the oxide of the memory cell 31, and therefore the well disturb may be avoided.

In the case of FIG. 4, the transistor N10 is configured to reduce the voltage difference across the gate oxide of the transistor N2 from 18V to 9V. Since the word line signal WL can be float to 9V, the junction reverse bias (i.e., gate-to-source voltage) of the transistor N10 can be as high as 9V+9V=18V compared with (9V+VT) in the local X-decoder 2 of the prior art. Therefore, n+ implantation dose of the transistor N10 need to be reduced to sustain the higher reverse bias.

Figure 5:
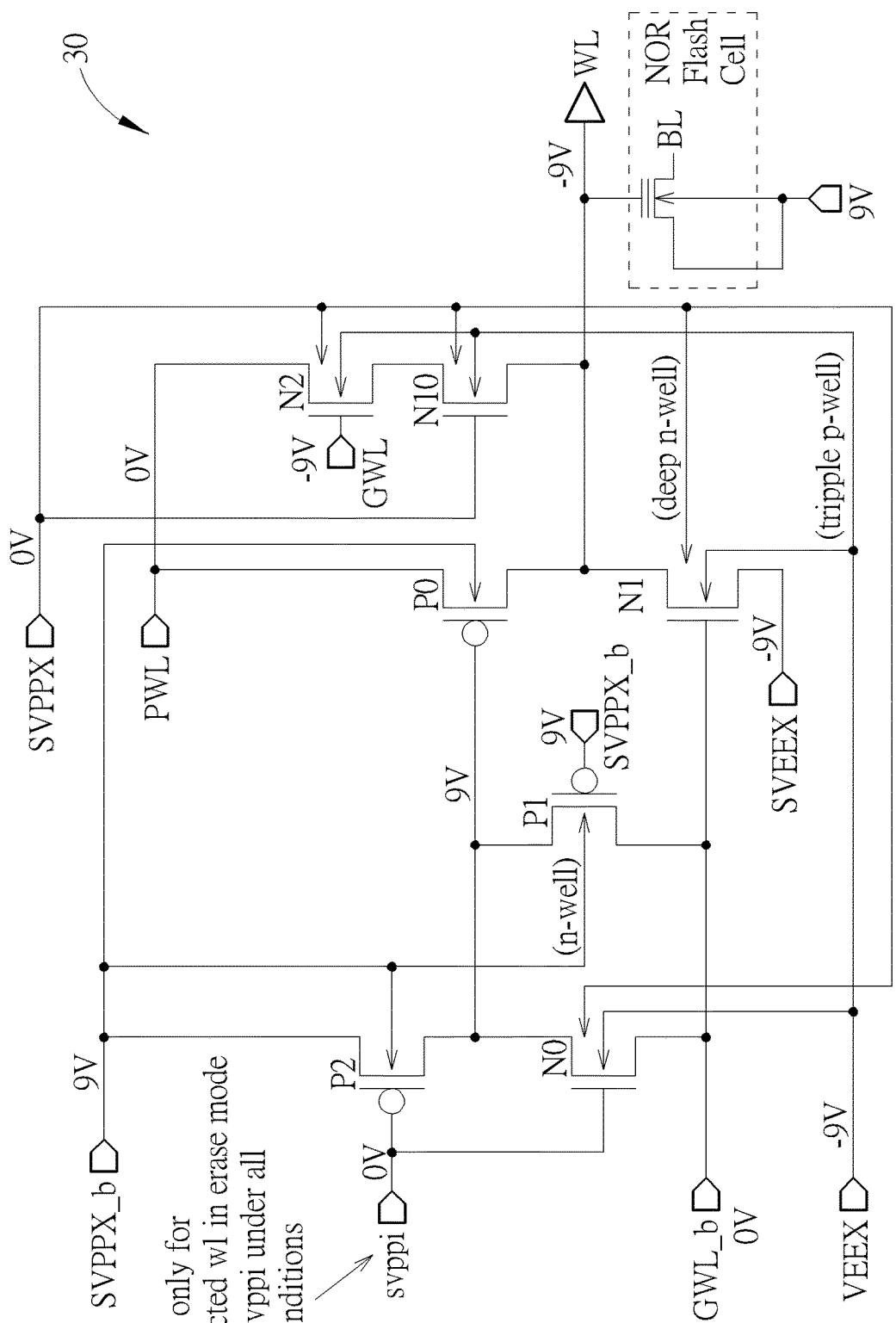
FIG. 5 is a schematic diagram of the local X-decoder in FIG. 3 according to an embodiment of the present invention.

FIG. 5 is a schematic diagram of the local X-decoder 30 in FIG. 3 according to an embodiment of the present invention. The local X-decoder 30 operates in different conditions in FIG. 4 and FIG. 5, respectively.

The operating conditions of FIG. 5 are summarized in Table 2 as follows. Note that the unselected erase mode signal svppi is 9V other than unselected erase mode.

TABLE 2

Operating conditions of FIG. 5

| Condition | Description |
|---|---|
| SVPPX_b = 9 V | Erase mode |
| Svppi = 9 V | Unselected local word line in erase mode |
| GWLb = 0 V | Unselected locally global word line |
| VEEX = −9 V | Selected bank erase mode |
| SVPPX = 0 V | Selected bank power |
| PWL = 0 V | Unselected local word line |
| GWL = −9 V | Selected global word line |
| SVEEX = −9 V | Selected sector |

The unselected erase mode signal svppi provides 9V to turn off the transistor P2 and turn on the transistor N0. The locally global word line signal GWLb provides 0V to the gate of the transistor P0 through the transistor N0, and the gate of the transistor N1 to turn on the transistor N1, so the so the transistor P0 is disconnected from the local word line signal PWL(=0V). Meanwhile, the sector voltage source SVEEX provides −9V to the word line signal WL through the transistor N1. This means the word line signal WL is floating at −9V and an erase bias cross the memory cell 31 is −9V-9V=−18V to erase the memory cell 31. In addition, a gate-to-source voltage of the transistor P0 in this case is −9-9=−18V. Therefore, p+ implantation dose also needs to be reduced to accommodate the higher reverse bias −18V.

To sum up, the present invention configures the unselected erase detecting unit comprising the transistors N0, P1 and P2 to increase the absolute voltage coupled to the word line signal from the well of the NOR flash cell, which keep the transistor P0 off when the word line signal WL rises to 9V through coupling so that a voltage difference between the well of the NOR flash cell and the unselected word line signal WL can be reduced to avoid well disturb failures. Further, the present invention configures the voltage clamping transistor N10 to reduce the voltage difference across the gate oxide of the transistor N2 by the amount of the threshold voltage VT of the transistor N10 to remove the reliability weak point (i.e., the gate oxide of the transistor N2) in the local X-decoder.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A local X-decoder for a memory system, comprising:
   a decoding unit configured to generate a word line signal to a memory cell of a memory array of the memory system; and
   an unselected erase detecting unit coupled to the decoding unit, and configured to increase an absolute voltage coupled to the word line signal from a well of the memory cell according to an unselected erase mode signal generated by an erase mode decoder of the memory system;
   wherein the word line signal is floating to a same level as the well of the memory cell when the memory cell is unselected in an erase mode of the memory system.

2. The local X-decoder of claim 1, wherein the decoding unit comprises:
   a first p-type P0 transistor comprising a source and a base coupled to a local word line signal PWL, a gate coupled to a locally global word line signal GWLb, and a drain, and configured to generate the word line signal to the memory cell;
   a first N-type transistor N1 comprising a drain coupled to the drain of the first p-type transistor, a gate coupled to the locally global word line signal, a base coupled to a bank mode voltage source VEEX, and a source coupled a sector voltage source SVEEX; and
   a second N-type transistor N2 comprising a drain coupled to the local word line signal, a gate coupled to a global word line signal GWL, a base coupled to the bank mode voltage source, and a source coupled to the drain of the first p-type transistor.

3. The local X-decoder of claim 2, wherein deep n-wells of the first N-type transistor and the second N-type transistor are coupled together, and the bases of the first N-type transistor and the second N-type transistor are formed in a triple p-well.

4. The local X-decoder of claim 2, wherein:
   the unselected erase mode signal is configured to indicate an unselected word line in erase mode;
   the bank mode voltage source is configured to select an operating mode for one of the plurality banks of the memory array of the memory system; and
   the sector voltage source is configured to select one of a plurality of sectors of one of the plurality banks of the memory array.

5. The local X-decoder of claim 2, wherein the unselected erase detecting unit comprises:
   a second P-type transistor P2 comprising a source and a base coupled to a local mode voltage source SVPPX_b, a gate coupled to the unselected erase mode signal, and a drain coupled to the gate of the first p-type transistor;
   a third N-type transistor N0 comprising a drain coupled to the drain of the second P-type transistor, a base coupled to the bank mode voltage source, agate coupled to the unselected erase mode signal, and a source coupled to the locally global word line signal and the gate of the first N-type transistor; and
   a third P-type transistor P1 comprising a source coupled to the drains of the second P-type transistor P2 and the third N-type transistor and the gate of the transistor first p-type, a gate and a base coupled to the local mode voltage source, and a drain coupled to the locally global word line signal, the source of the third N-type transistor and the gate of the first N-type transistor.

6. The local X-decoder of claim 5, wherein the bases of the second P-type transistor and the third P-type transistor are formed in an n-well, the base of the third N-type transistor is formed in a triple p-well together with the bases of the first N-type transistor and the second N-type transistor, and deep n-well of the third N-type transistor is coupled together with the first N-type transistor and the second N-type transistor.

7. The local X-decoder of claim 5, wherein third N-type transistor and the third P-type transistor are configured to separate the gates of the first N-type transistor and the first p-type transistor.

8. The local X-decoder of claim 5, wherein the local mode voltage source is configured to indicate an erase mode for the memory cell, and the memory cell is a NOR flash memory cell.

9. The local X-decoder of claim 2, wherein further comprising:
a fourth N-type transistor N10 comprising a drain coupled to the source of the second N-type transistor, a gate coupled to the local mode voltage source, a base coupled to the bank mode voltage source, and a source coupled to the drains of the first p-type transistor and the first N-type transistor.

10. The local X-decoder of claim 9, wherein the fourth N-type transistor is configured to be a voltage clamping transistor in the local X-decoder to reduce a voltage difference across a gate oxide of the second N-type transistor by an amount of a threshold voltage of the fourth N-type transistor, and the base of the fourth N-type transistor is formed in a triple p-well together with the bases of the third N-type transistor, the first N-type transistor and the second N-type transistor.

11. A memory system, comprising:
a memory array comprising a memory cell;
a power source configured to generate a first voltage source VPPX;
a bank decoder configured to generate a local mode voltage source SVPPX_b;
an erase mode decoder coupled to the bank decoder and the power source, and configured to generate an unselected erase mode signal according to the first voltage source and the local mode voltage source;
a local X-decoder coupled to the memory cell and the erase mode decoder, comprising:
a decoding unit configured to generate a word line signal to of the memory cell; and
an unselected erase detecting unit coupled to the decoding unit, and configured to increase an absolute voltage coupled to the word line signal from a well of the memory cell according to the unselected erase mode signal;
wherein the word line signal is floating when the memory cell is unselected in an erase mode of the memory system.

12. The memory system of claim 11, wherein the decoding unit comprises:
a first p-type transistor P0 comprising a source and a base coupled to a local word line signal PWL, a gate coupled to a locally global word line signal GWLb, and a drain, and configured to generate the word line signal to the memory cell;
a first N-type transistor N1 comprising a drain coupled to the drain of the first p-type transistor, a gate coupled to the locally global word line signal, a base coupled to a bank mode voltage source VEEX, and a source coupled a sector voltage source SVEEX; and
a second N-type transistor N2 comprising a drain coupled to the local word line signal, a gate coupled to a global word line signal GWL, a base coupled to the bank mode voltage source, and a source coupled to the drain of the first p-type transistor.

13. The memory system of claim 12, wherein deep n-wells of the first N-type transistor and the second N-type transistor are coupled together, and the bases of the first N-type transistor and the second N-type transistor are formed in a triple p-well.

14. The memory system of claim 12, wherein
the unselected erase mode signal is configured to indicate an unselected word line in erase mode;
the bank mode voltage source is configured to select an operating mode for one of the plurality banks of the memory array of the memory system; and
the sector voltage source is configured to select one of a plurality of sectors of one of the plurality banks of the memory array.

15. The memory system of claim 12, wherein the unselected erase detecting unit comprises:
a second P-type transistor P2 comprising a source and a base coupled to a local mode voltage source SVPPX_b, a gate coupled to the unselected erase mode signal, and a drain coupled to the gate of the first p-type transistor;
a third N-type transistor N0 comprising a drain coupled to the drain of the second P-type transistor, a base coupled to the bank mode voltage source, a gate coupled to the unselected erase mode signal, and a source coupled to the locally global word line signal and the gate of the first N-type transistor; and
a third P-type transistor P1 comprising a source coupled to the drains of the second P-type transistor P2 and the third N-type transistor and the gate of the transistor first p-type, a gate and a base coupled to the local mode voltage source, and a drain coupled to the locally global word line signal, the source of the third N-type transistor and the gate of the first N-type transistor.

16. The memory system of claim 15, wherein the bases of the second P-type transistor and the third P-type transistor are formed in an n-well, the base of the third N-type transistor is formed in a triple p-well together with the bases of the first N-type transistor and the second N-type transistor, and deep n-well of the third N-type transistor is coupled together with the first N-type transistor and the second N-type transistor.

17. The memory system of claim 15, wherein third N-type transistor and the third P-type transistor are configured to separate the gates of the first N-type transistor and the first p-type transistor, the local mode voltage source is configured to indicate an erase mode for the memory cell, and the memory cell is a NOR flash memory cell.

18. The memory system of claim 12, wherein the local X-decoder further comprises:
a fourth N-type transistor N10 comprising a drain coupled to the source of the second N-type transistor, a gate coupled to the local mode voltage source, a base coupled to the bank mode voltage source, and a source coupled to the drains of the first p-type transistor and the first N-type transistor.

19. The memory system of claim 18, wherein the fourth N-type transistor is configured to be a voltage clamping transistor in the local X-decoder to reduce a voltage difference across a gate oxide of the second N-type transistor by an amount of a threshold voltage of the fourth N-type transistor, and the base of the fourth N-type transistor is formed in a triple p-well together with the bases of the third N-type transistor, the first N-type transistor and the second N-type transistor.

20. The memory system of claim 12, further comprising:
a local word line decoder coupled to the bank decoder and the local X-decoder, and configured to generate the local word line signal PWL according to a second voltage source SVPPX;
a global word line decoder coupled to the bank decoder and the local X-decoder, and configured to generate the locally global word line signal GWLb and the global word line signal GWL according to the second voltage source SVPPX and the bank mode voltage source VEEX;
a sector decoder coupled to the local X-decoder, and configured to generate the sector voltage source SVEEX according to the bank mode voltage source VEEX; and
a bank mode decoder coupled to the global word line decoder and the sector decoder, and configured to generate the bank mode voltage source VEEX.

* * * * *